(12) United States Patent
Schwanka Trevisan et al.

(10) Patent No.: US 11,899,050 B2
(45) Date of Patent: Feb. 13, 2024

(54) WIND TURBINE AND METHOD FOR DETECTING LOW-FREQUENCY OSCILLATIONS IN AN ELECTRICAL SUPPLY GRID

(71) Applicant: Wobben Properties GmbH, Aurich (DE)

(72) Inventors: Aramis Schwanka Trevisan, Aurich (DE); Kaveh Malekian Boroujeni, Bremen (DE)

(73) Assignee: Wobben Properties GmbH, Aurich (DE)

( * ) Notice: Subject to any disclaimer, the term of this patent is extended or adjusted under 35 U.S.C. 154(b) by 416 days.

(21) Appl. No.: 17/270,820

(22) PCT Filed: Aug. 23, 2019

(86) PCT No.: PCT/EP2019/072601
§ 371 (c)(1),
(2) Date: Feb. 23, 2021

(87) PCT Pub. No.: WO2020/039077
PCT Pub. Date: Feb. 27, 2020

(65) Prior Publication Data
US 2021/0341523 A1    Nov. 4, 2021

(30) Foreign Application Priority Data

Aug. 24, 2018  (DE) ..................... 10 2018 120 768.9

(51) Int. Cl.
*G01R 23/177*  (2006.01)
*H02J 3/24*    (2006.01)
*H02J 3/38*    (2006.01)

(52) U.S. Cl.
CPC ............ *G01R 23/177* (2013.01); *H02J 3/241* (2020.01); *H02J 3/381* (2013.01); *H02J 2300/28* (2020.01)

(58) Field of Classification Search
CPC ... G01R 23/177; G01R 19/2513; H02J 3/241; H02J 3/381; H02J 2300/28; H02J 3/0012; Y02E 10/76
See application file for complete search history.

(56) References Cited

U.S. PATENT DOCUMENTS

| 4,031,462 A | 6/1977 | Bouvier et al. |
| 5,677,852 A | 10/1997 | Juhlin |

(Continued)

FOREIGN PATENT DOCUMENTS

| CA | 1242484 A | 9/1988 |
| CN | 104820164 A | 8/2015 |

(Continued)

OTHER PUBLICATIONS

Alhaj et al., "Power System Harmonics Estimation Using Sliding Window Based LMS", 2013 IEEE International Conference on Signal and Image Processing Applications (ICSIPA), Oct. 8, 2013, pp. 327-332.

(Continued)

*Primary Examiner* — Tung S Lau
(74) *Attorney, Agent, or Firm* — Seed IP Law Group LLP

(57) ABSTRACT

A method for detecting low-frequency oscillations, in particular subsynchronous resonances, in a grid is provided. The method includes recording a series of measurements, having measurement points, of a grid variable over a measurement time period, for performing a frequency analysis and multiplying the series a time-dependent sinusoidal test function for the same measurement time period. The test function is characterized by a test frequency and a test angle (Continued)

as phase angle. The series for each measurement point is multiplied by the test function in order to obtain a test product for each measurement point. The method includes adding the test products taking into consideration the mathematical sign thereof to give a product sum, and evaluating, depending on the product sum, whether the series of measurements has a low-frequency oscillation having a frequency in the region of the test frequency and a phase angle in the region of the test angle.

19 Claims, 7 Drawing Sheets

(56) References Cited

U.S. PATENT DOCUMENTS

| | | | | |
|---|---|---|---|---|
| 7,508,224 | B2* | 3/2009 | Williams | G01R 27/32 |
| | | | | 324/707 |
| 11,637,428 | B2* | 4/2023 | Roop | H02J 3/24 |
| | | | | 700/292 |
| 2007/0241759 | A1* | 10/2007 | Williams | G01R 27/32 |
| | | | | 324/600 |
| 2019/0064232 | A1* | 2/2019 | Zhang | H02J 3/24 |

FOREIGN PATENT DOCUMENTS

| | | |
|---|---|---|
| CN | 105472382 A | 4/2016 |
| CN | 106841778 A | 6/2017 |
| DE | 3733555 A1 | 4/1989 |
| RU | 2442180 C1 | 2/2012 |

OTHER PUBLICATIONS

Jacobsen et al., "The Sliding DFT", IEEE Signal Processing Magazine, vol. 20, No. 2, Mar. 2003, pp. 74-80.

Kamwa et al., "Robust Detection and Analysis of Power System Oscillations Using the Teager-Kaiser Energy Operator" IEEE Transactions On Power Systems, vol. 26, No. 1, Feb. 2011, pp. 323-333.

Shadmehr et al., "Beyond EFT algorithm in analyzing harmonics at frequency range of 2 kHz to 500 kHz" 2018 18th International Conference On Harmonics And Quality Of Power (ICHQP), IEEE, May 13, 2018, pp. 1-6.

Zhuo et al., "A High Performance Continuous Data Flow Filter Using Sliding Discrete Fourier Transform (DFT) and One Point Inverse DFT", IEEE, 1998, pp. 51-56.

Zhu et al., "Low frequency oscillation mode recognition based on segmental Fourier neural network algorithm," Power System Protection and Control, 40(15), Aug. 1, 2012. (6 pages).

* cited by examiner

```
┌─────────────────────────────────────────┐
│ summing a plurality of products of the plurality of │
│ measurement points to produce a product sum. The    │      702
│ summing the plurality of products includes retaining a │
│ plurality of signs of the plurality of products,    │
│ respectively                            │
└─────────────────────────────────────────┘
                      │
                      ▼
┌─────────────────────────────────────────┐
│ determining, based on the product sum, whether at   │      704
│ least one series of measurements has a low-frequency │
│ oscillation having an oscillation frequency in a region │
│ of the test frequency and a phase angle in a region of │
│ the test angle, wherein the oscillation frequency is │
│ below the rated line frequency          │
└─────────────────────────────────────────┘
```

*Fig. 7*

WIND TURBINE AND METHOD FOR DETECTING LOW-FREQUENCY OSCILLATIONS IN AN ELECTRICAL SUPPLY GRID

BACKGROUND

Technical Field

The present invention relates to a method for detecting low-frequency oscillations, in particular subsynchronous resonances, in an electrical supply grid. The present invention also relates to a wind power system, namely a wind turbine or a wind farm, for detecting low-frequency oscillations, in particular subsynchronous resonances, in an electrical supply grid.

Description of the Related Art

Many electrical supply grids increasingly have regenerative power generating units, in particular wind turbines or wind farms. The increasing proportion of these in the electrical supply grid means that it is also becoming increasingly more important to use wind turbines and wind farms for supporting the electrical supply grid, or at least to consider them in addition.

One problem which may occur in the electrical supply grid, which can also simply be referred to as grid, are oscillations, namely oscillations of the power system, which can also be referred to as "power system oscillations" (PSO). There may be a great variety of causes for such power system oscillations, and a clear and simple example is that two directly coupled synchronous generators of conventional power stations which inject, for example, at a distance from one another of over 100 kilometers, oscillate in opposition to one another.

However, it is also possible that even a single synchronous generator which is coupled directly to the electrical supply grid is caused to oscillate at its natural frequency owing to local excitation, such as a sudden change in the power consumption of the connected consumers. Conventional electrical supply grids counteract such problems generally as a result of correspondingly stable regulation of the synchronous generators injecting directly into the electrical supply grid. A high degree of inertia of these synchronous generators together with a damping behavior which is physically dependent and/or dependent on the structural design of the respective generator generally prevents the excessive occurrence of such oscillations in conventional grids.

Regenerative generating units, in particular wind turbines or wind farms, however, do not have such properties per se. In particular, they have virtually no physically dependent properties which can counteract such low-frequency oscillations or could avoid such low-frequency oscillations from the outset.

Instead, modern wind turbines or wind farms nowadays inject into the electrical supply grid by means of frequency converters using a so-called full-power converter concept. Accordingly, the total injected power is injected into the electrical supply grid by the inverter(s) according to precise presets. These presets particularly relate to amplitude, frequency and phase of the injected electrical current, and these presets can be preset via a process control computer. In this case, there is little room for physically dependent reactions or adaptations of the injected current.

In order nevertheless to be able to react to phenomena in the electrical supply grid, in particular in order to be able to react to low-frequency oscillations, i.e., so-called PSO, such oscillations would therefore need to be detected first, ideally on the basis of frequency, phase angle and amplitude. On the basis of this, a desired reaction measure could then be calculated in the process control computer in order for this then to be converted by means of the inverter.

If such a low-frequency oscillation is not detected sufficiently accurately, however, any countermeasures can make the present situation even worse. In this case, such a detection of low-frequency oscillations can be difficult because these low-frequency oscillations first have a comparatively low amplitude of the line frequency, i.e., the 50 Hz or 60 Hz voltage signal in the electrical supply grid, superimposed on them. In particular in the case of the voltage measurement in the electrical supply grid, it also arises that interference and/or noise can be expected. In addition, such low-frequency oscillations generally fluctuate. Particularly, they occur to a weak or strong extent or not at all, depending on the excitation.

Despite these measurement problems, however, a detection which is as quick as possible is desirable. This in turn stands in the way of a longer-term analysis.

There is the additional problem that such low-frequency oscillations can be in a frequency range of 0.05 Hz, or even lower, up to frequency values just below the line frequency, i.e., up to the order of magnitude of 50 to 60 Hz, or even slightly higher. From a purely physical point of view, the detection of a sinusoidal oscillation requires a measurement over the time period of at least one half-cycle of this oscillation. In the case of a large frequency spectrum, the detection thereof therefore requires a measurement period at least over one half-cycle of the oscillation at the lowest frequency to be expected.

The German Patent and Trademark Office have searched the following prior art in the priority application relating to the present application: DE 3733555 A1 and U.S. Pat. No. 4,031,462 A.

BRIEF SUMMARY

Provided herein are techniques and systems for enabling detection of low-frequency oscillations that is quick whilst at the same time it being possible to detect even very low-frequency oscillations.

A method is proposed. This method serves to detect low-frequency oscillations in an electrical supply grid, in particular to detect subsynchronous resonances in an electrical supply grid. In this case, an electrical supply grid which has a line voltage with a rated line frequency is assumed, wherein the low-frequency oscillations to be detected preferably have a lower frequency than the rated line frequency. In this case, therefore, anything which has a lower frequency than the rated line frequency is in particular referred to and considered as low-frequency oscillation. Preferably, a frequency lower than half the rated line frequency is assumed to be a frequency of the low-frequency oscillations.

In particular, the low-frequency oscillations can have values of 1 Hz or less. However, they can also reach up to five times the value of the rated line frequency. In this case, oscillations with a frequency of a maximum of five times the value of the rated line frequency, preferably with a frequency which corresponds to the rated line frequency as a maximum, are referred to as low-frequency oscillations. In particular, the low-frequency oscillation does not have a frequency which corresponds to a multiple of the rated line frequency. It should be noted that the investigation and consideration of low-frequency oscillations particularly serves the investigation or the ensuring of a system stability of the electrical supply grid. This is separate from an assessment of the grid quality or signal quality of the voltage signal on the electrical supply grid, where in particular it is a question of harmonics, in particular integral harmonics.

The method proposes recording at least one series of measurements having a plurality of measurement points over a measurement time period in order to perform, on the basis thereof, a frequency analysis. The series of measurements therefore has a plurality of measurement points or measured values, which are namely distributed over the measurement time period or have been recorded distributed over the measurement time period.

As grid variable, in particular the line voltage, an input current injected into the electrical supply grid or a line frequency is recorded.

For this series of measurements, then multiplication of the series of measurements by a time-dependent sinusoidal test function for the same measurement time period is proposed. Such a sinusoidal test function can be provided as a function on a process control computer. It is proposed that the test function is characterized by a test frequency and a test angle as phase angle. The amplitude can also be preset, but in a practical realization generally a standardization of the amplitude, for example, to the value 1, is possible. The peak value of the sinusoidal variable can accordingly assume, for example, the value 1, wherein the scaling in the process control computer can be known.

The multiplication of the series of measurements by the test function takes place in such a way that the series of measurements for each measurement point is multiplied by the test function in order to obtain a test product for each measurement point. Therefore, a measured value relating to the measurement point of the series of measurements is multiplied by the corresponding function value of the test function, and this is repeated for each measurement point. The test function is preset correspondingly for a length of time which corresponds to the measurement time period or the test function is determined for the measurement time period. The multiplication then takes place in each case for each time point of the measurement time period at which a measured value is present. This measured value is then multiplied by the function value of the test function of the same time point.

The test products are now added taking into consideration the mathematical sign thereof to give a product sum. Negative test products are therefore subtracted according to absolute value. Each test product can namely have a negative mathematical sign if either the relevant measured value or the relevant function value was negative.

Depending on the product sum, an evaluation is then performed to ascertain whether the series of measurements has a low-frequency oscillation having a frequency in the region of the test frequency and a phase angle in the region of the test angle.

This is based in particular on the following consideration. If the test function and the series of measurements are identical in terms of frequency and phase, each test product will have a positive value and correspondingly the product sum will likewise be positive with a comparatively large amplitude. Then, the series of measurements reproduces a function which corresponds to the test function.

If the series of measurements and the test function are identical but are phase-shifted through 90° with respect to one another, the test products would give a sinusoidal function (incidentally with double the frequency for the test function), to be precise without a DC component. The product sum would then be zero, at any rate if the investigation time period corresponds to an integral multiple of the period of the investigated signal. The phenomenon is known to an electrical engineer moreover as reactive power if the current and the voltage are shifted through 90° with respect to one another. The first-mentioned example without a phase shift would correspond to a case exclusively with active power. Namely a sinusoidal signal with double the frequency which is shifted so severely about the horizontal axis that even the smallest values of the sine function would touch the horizontal axis would result. This shift can also be interpreted or referred to as DC component. Here, the DC component would therefore be very high, namely at its highest.

However, even discrepancies in the frequency between the series of measurements and the test function can result in different DC components. The product sum, which can therefore be interpreted as a DC component or can be representative of the DC component, can therefore also stand as a measure of the correlation between the series of measurements and the test function. If the series of measurements and the test function are completely uncorrelated, the DC component is zero, in any case theoretically for an infinite measurement time period.

However, even in a practical implementation, the product sum is at least comparably small if the series of measurements and the test function are uncorrelated. If the series of measurements and the test function are well correlated and the phase angles of the series of measurements and the test function also match one another, a high DC component or a large product sum results. It is possible to derive from this the presence of a low-frequency oscillation on the basis of frequency and phase. The low-frequency oscillation then namely has the frequency of the test function and the phase angle correspondingly of the test angle of the test function.

Preferably, on detection of a low-frequency oscillation, an amplitude of the low-frequency oscillation is detected, in particular depending on the product sum. It has been identified in particular that, by virtue of the method for detecting a low-frequency oscillation according to frequency and phase, the amplitude can also be determined.

Preferably, the method is implemented in such a way that the multiplication of the series of measurements by the test function and the addition of the test products to give a product sum is repeated whilst varying the test frequency and whilst varying the test angle in order in the process to obtain a plurality of product sums. In principle, it is also advantageous only to vary the test frequency or the test angle, but as long as neither the frequency of the low-frequency signal to be detected nor the phase thereof is known, it is usually advantageous to vary the test frequency and the test angle. If both values are varied, the result of the product sums can also be represented as a curved plane. Then, the product sum would be represented depending on the test frequency and the test angle. A local maximum would then result at the test frequency and the test angle at which there is the best correspondence between the series of measurements and the test function.

It is therefore proposed that the evaluation to ascertain whether the series of measurements has a low-frequency oscillation is performed depending on the plurality of product sums thus obtained. Therefore, all of the product sums obtained in the process can be set against one another and from this the presence of a low-frequency oscillation can be detected if it then has a frequency and a phase which are in the vicinity of the test frequency and the test angle, respectively.

In particular, therefore, in the case of a product sum with a maximum amplitude in relation to the remaining product sums, a low-frequency oscillation having the frequency and the phase of the associated test frequency and the associated test angle is assumed. For this evaluation of all of the product sums, it is not absolutely necessary to select an abovementioned three-dimensional representation. It is also possible simply to search for maximum values of the product sums or in the simplest case for the maximum product sum.

In particular, it is therefore proposed that the multiplication of the series of measurements by the test function and the addition of the test products to give a product sum is repeated whilst varying the test frequency and whilst varying the test angle, with the result that a product sum is recorded for each test pair formed from a test frequency value and a value for the test angle. This takes place in particular in such a way that the recorded product sums can be represented, depending on the test frequency values and depending on the test angles, as a curved area in a three-dimensional space, wherein they do not absolutely need to be represented.

In this case, in particular in relation to the evaluation, it is proposed that, in the case of a product sum with a maximum amplitude in relation to the remaining product sums, a low-frequency oscillation having the frequency and the phase of the associated test frequency and the associated test angle is assumed. In principle, it is naturally also possible to interpolate if a plurality of adjacent product sums form a maximum, i.e., are identical or almost identical in size.

As a result, in particular also an evaluation is fully automatically programmable. In principle, only the frequency range to be tested needs to be preset. If appropriate, the increment with which the test frequency is varied can also be preset.

The test angle is preferably tested or varied from 0° to 360°. If appropriate, it is possible to test it only from 0° to 180° and, in the search for the maximum product sum, to search for the maximum product sum according to absolute value.

In accordance with one embodiment, it is proposed that, in order to assume a low-frequency oscillation of a product sum, a test is exclusively or additionally performed to ascertain whether the product sum reaches at least a predetermined test amplitude. In particular this is based on the assumption that already simply on the basis of the practical implementation in any case a maximum product sum should be expected if, as described, test frequencies and test angles are varied. It would then not yet be possible to derive from this that actually a low-frequency oscillation or a relevant low-frequency oscillation is present since very small maxima can also be caused by measurement inaccuracies or other influences.

The testing to ascertain whether the product sum has reached at least a predetermined test amplitude also makes it possible to detect, if appropriate, a plurality of low-frequency oscillations should a plurality of low-frequency oscillations be present. In particular, in order to select the illustrative explanation on the basis of the curved area of the product sum, a local maximum in this curved area can also be found by testing to ascertain if a predetermined test amplitude has been reached.

Naturally, in the case of a plurality of product sums which are adjacent to one another or at least close to one another in terms of frequency and phase angle, it should usually not be assumed that a plurality of low-frequency oscillations are present. Such an accumulation of large product sums then indicates a maximum within which preferably the maximum product sum is selected as that whose test frequency and test angle should be assumed as the frequency and phase of a detected low-frequency oscillation.

In accordance with one embodiment, it is proposed that, in a first test loop, the multiplication of the series of measurements by the test function and the addition of the test products is repeated whilst varying the test frequency. In this case, the test frequency is varied within a first frequency range in order to detect a low-frequency oscillation having an oscillation frequency. The oscillation frequency is first detected with a first accuracy. In a second test loop, the multiplication of the series of measurements by the test function and the addition of the test products is repeated whilst varying the test frequency. The test frequency is then, with this repetition in the second test loop, varied within a second frequency range. For this purpose, the second frequency range is selected depending on the oscillation frequency detected in the first test loop in order to detect the oscillation frequency with a higher accuracy than in the first loop.

This is based in particular on the concept that the testing of many test frequencies and many test angles can result in a high number of tests. It is therefore proposed to first insert a first test loop which only varies the test frequency, possibly with a first frequency increment which is greater than a later second frequency increment with which variation is performed in the second test loop. By virtue of such a first test loop, a first overshoot in terms of absolute value should occur at least in the vicinity of a frequency of a low-frequency oscillation.

In the region of this first overshoot, testing can be performed more precisely then. For this purpose, the second frequency range is preset, which in particular is less than the first frequency range, in particular in this case is within the first frequency range. In this second test loop, then in addition the test angle can be varied. A high degree of accuracy can thus be achieved without this high accuracy needing to be performed throughout the theoretical range which results from the first frequency range and a complete 360° range for the test angle.

Preferably, in this case in the first test loop, the multiplication of the series of measurements by the test function and the addition of the test products is additionally repeated whilst varying the test angle. Therefore, the test frequency and the test angle are varied. In this case, the test angle is varied within a first angle range, in particular within the range of from 0° to 360°, which can preferably also be restricted to 0° to 180° or to another 180° range, however. This takes place in order to detect the low-frequency oscillation additionally with a phase angle of the oscillation. In addition, despite a well-corresponding frequency between the low-frequency oscillation and the test function, the product sum can have a low value in terms of absolute value if the phase angle and the test angle differ severely from one another. In this case, a low-frequency oscillation could be overlooked.

Furthermore, it is proposed in this regard that the test angle is varied with a first angle increment, i.e., in 5° steps, for example. In the second test loop, the multiplication of the series of measurements by the test function and the addition of the test products is additionally repeated whilst varying the test angle, wherein the test angle is varied within a second angle range. This variation preferably takes place with a second angle increment which is less than the first angle increment, for example, with a second angle increment of 1°. In particular, the second angle range is selected depending on the phase angle of the oscillation detected in the first test loop in order to detect the phase angle of the oscillation with a higher accuracy than in the first loop.

It is therefore proposed, in the first test loop, to vary the test frequency and the test angle and as a result perform a first rough detection for at least one low-frequency oscillation, namely determine a rough value of the frequency of the low-frequency oscillation and a rough value of the phase angle of the low-frequency oscillation. In a range around this frequency and this angle, the search can then be improved by virtue of the test frequency and the test angle being tested in a smaller frequency range and also a smaller angle range there.

In accordance with one embodiment, it is proposed that, in the first test loop, the test frequency is varied with larger frequency steps than in the second test loop, and in addition or as an alternative, in the first test loop, the test angle is varied with larger angle steps than in the second test loop. As a result, in the first test loop, a large frequency range can be tested with a reasonable complexity level. Also, a large angle range, namely in particular the entire angle range of from 0 to 360°, at least 0 to 180°, can be tested. Therefore, a first localization of a low-frequency oscillation can be performed with a nevertheless reasonable complexity level. A precise search is then required in the second test loop with a higher accuracy now only for a smaller range, namely both a smaller frequency range and a smaller angle range.

In accordance with a further configuration, it is proposed that a plurality of series of measurements of the grid variable is recorded. That is to say that a plurality of series of measurements, in particular of the line voltage, the input current or the line frequency, is recorded. In this case, each series of measurements is intended for analyzing a frequency range. For this purpose, for each series of measurements, a measurement time period is selected depending on the frequency range to be analyzed. That is to say that different frequency ranges are investigated and for this in each case corresponding series of measurements are recorded. In particular in this regard, it is proposed to select the measurement time period for analyzing a frequency range of a low-frequency to be long, namely so long that even the lowest frequency of the frequency range can still be detected. Correspondingly, for a frequency range of a higher frequency, a shorter measurement time period can be provided. In addition, it is preferably proposed that, given correspondingly long measurement time periods, the measurement time points are further apart from one another than in the case of a shorter measurement time period.

It is therefore proposed in particular for a frequency range to be investigated overall, such as, for example, 0.1 Hz or below to 50 Hz or even 250 Hz to perform a division into at least two measurement ranges, in particular into a low-frequency frequency range and a higher-frequency frequency range. There is therefore a division into a first frequency range and a second frequency range, if appropriate into even further frequency ranges. For each frequency range to be analyzed, i.e., by way of example, for the low-frequency frequency range and the higher-frequency frequency range, a series of measurements is recorded. For the mentioned example, therefore, two series of measurements are recorded.

For each series of measurements, the multiplication of the series of measurements by the test function and the addition of the test products to give a sum is then repeated whilst varying the test frequency and in addition or as an alternative whilst varying the test angle in order to obtain a plurality of product sums for each series of measurements. It is further proposed that, for each series of measurements, in each case the product sums of the relevant series of measurements are evaluated for detecting a low-frequency oscillation.

This is in particular based on the knowledge that, for the investigation of a low-frequency frequency range, on the one hand, and a higher-frequency frequency range, on the other hand, different measurement times, i.e., measurement time periods, are used as a basis, which should be considered in a sensible manner. On the other hand, such a long measurement time period for a low-frequency oscillation with a comparatively high frequency may be too long to detect this low-frequency oscillation in good time.

For example, the first frequency range, which can also be referred to as low-frequency frequency range, can extend from 0.02 to 2 Hz. In order to be able to detect a low-frequency oscillation with 0.02 Hz, at least a measurement time period of the inverse value, i.e., a measurement time period of 50 seconds, should be used. The second frequency range, which can also be referred to as higher-frequency frequency range, could then extend, for example, from 2 Hz to 250 Hz. Here, a measurement time duration of 0.2 seconds is sufficient even for detecting the lowest frequency of 2 Hz. In this case, an oscillation within such a second or higher-frequency frequency range within the test time period of 50 seconds of the first frequency range can, if appropriate, be increased significantly, in the extreme case result in a resonance catastrophe or at least the situation whereby the amplitude of the low-frequency oscillation has become so great that first damage can occur or first disconnection processes can be initiated.

In order to counteract this dilemma, it is proposed here to perform at least a division into two frequency ranges and in particular also to perform the analyses temporally independently of one another.

In accordance with one embodiment, it is proposed that the multiplication of the series of measurements by the test function and the addition of the test products to give a product sum is repeated whilst specifically varying of the test frequency. The test frequency is in this case namely varied within at least one frequency range having an upper and a lower frequency value with a frequency increment, and in this case the frequency increment is set depending on the frequency range. This takes place in particular in such a way that the frequency increment is less than the lower frequency value, in particular less than 10% of the lower frequency value. In addition or as an alternative, it is proposed that the frequency increment is less than a predetermined percentage value, in particular that it is set to be less than 1%, in particular less than 0.2% of the upper frequency value.

Preferably, the test frequency is varied within a plurality of frequency ranges, and the frequency increments of different frequency ranges are set to be different than one another. Preferably, each frequency increment is in each case set to be greater than a predetermined percentage of the respective lower frequency value of the relevant frequency range.

The test frequency is therefore varied in accordance with the respective frequency increment in the respective frequency range. The frequency increment is in this case set depending on the frequency range and in the process is based in particular on the lowermost frequency value of the respective frequency range. For this purpose, a percentage value based on the lower frequency value can be provided.

However, the frequency increment can also be based on the upper frequency value, but in this case it is selected to be comparatively much lower than the upper frequency value of the relevant frequency range. In particular it is achieved hereby that the variation in the test frequency is clearly preset and is also selected differently for different frequency ranges. Therefore, the complexity involved in the testing, namely on the basis of the complexity involved in the variation, can be matched to the respective frequency range. The presets also enable an automated test routine.

A wind power system is also proposed. Such a wind power system may be a wind turbine or a wind farm having a plurality of wind turbines. This wind power system, in accordance with appropriate regulations, injects into an electrical supply grid. It is set up for detecting low-frequency oscillations, in particular subsynchronous resonances, in the electrical supply grid. The electrical supply grid has a line voltage with a rated line frequency. The wind system comprises

- a recording means for recording at least one series of measurements, having a plurality of measurement points, of a grid variable, in particular the line voltage, an input current or a line frequency, over a measurement time period, for performing a frequency analysis,
- a multiplication unit for multiplying the series of measurements by a time-dependent sinusoidal test function for the same measurement time period, wherein the test function is characterized by a test frequency and a test angle as phase angle, and the series of measurements for each measurement point is multiplied by the test function in order to obtain a test product for each measurement point,
- an addition unit for adding the test products taking into consideration the mathematical sign thereof to give a product sum, and
- an evaluation device for evaluating, depending on the product sum, whether the series of measurements has a low-frequency oscillation having a frequency in the region of the test frequency and a phase angle in the region of the test angle.

Such a wind power system can therefore inject into the electrical supply grid and preferably also performs support functions for supporting the electrical supply grid. Such support functions can in particular be necessary or at least advantageous when decentralized generating units, such as also such a wind power system, to a significant proportion inject into the electrical supply grid or into a relevant section of the electrical supply grid. Various support functions can arise, wherein one may be to respond to a low-frequency oscillation. Preferably, such a low-frequency oscillation is, however, detected first, as precisely as possible according to frequency and phase, possibly also according to amplitude. Then, a response to this low-frequency oscillation is possible.

Preferably, the wind power system is set up to at least perform a method in accordance with the embodiments described above. In particular, the wind power system has, for this purpose, a process control computer (controller), which is set up to perform such a method. In particular, the method is implemented for this purpose on the process control computer. The implementation of the method can in this case comprise that the recording of the measurement points or the series of measurements or a plurality of series of measurements is implemented by virtue of the fact that the process control computer receives corresponding values as measurement points or measured values and/or that the process control computer drives the recording means in order to thereby record the at least one series of measurements.

The recording means can in particular be a sensor, which measures, for example, a voltage or a current. The multiplication unit can likewise be implemented in the same or another process control computer. The same applies to the addition unit, although these units can also form different device units. The evaluation device can likewise be implemented in one or the same process control computer or otherwise be provided as a dedicated element.

BRIEF DESCRIPTION OF THE SEVERAL VIEWS OF THE DRAWINGS

The invention will now be explained in more detail below by way of example with reference to the attached figures.

FIG. 7 shows, a flow chart of a portion of a method.

DETAILED DESCRIPTION

Figure 1:
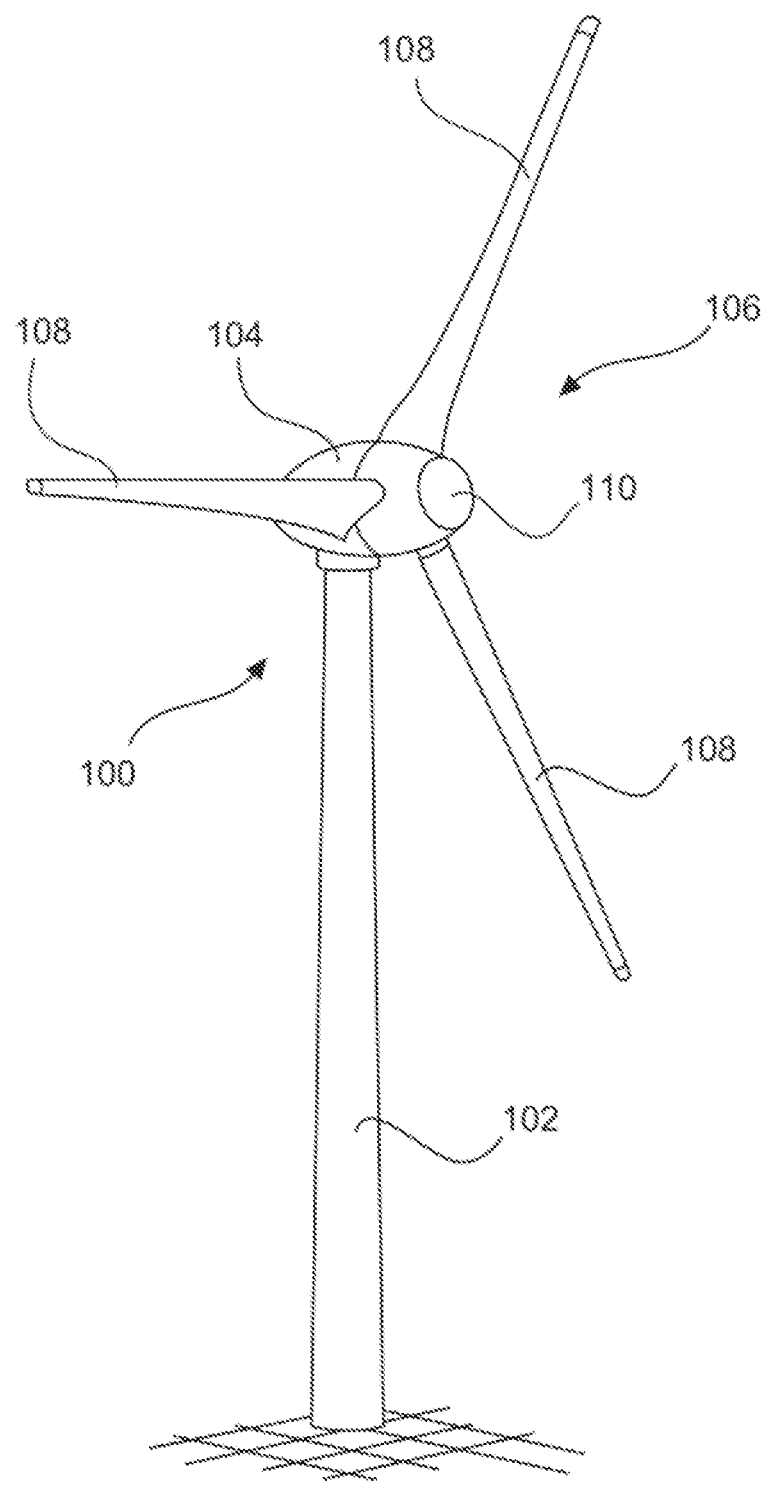
FIG. 1 shows a wind turbine in a perspective illustration.

FIG. 1 shows a wind turbine 100 comprising a tower 102 and a nacelle 104. A rotor 106 comprising three rotor blades 108 and a spinner 110 is arranged on the nacelle 104. The rotor 106 is set in rotary motion by the wind during operation and thereby drives a generator in the nacelle 104.

Figure 2:
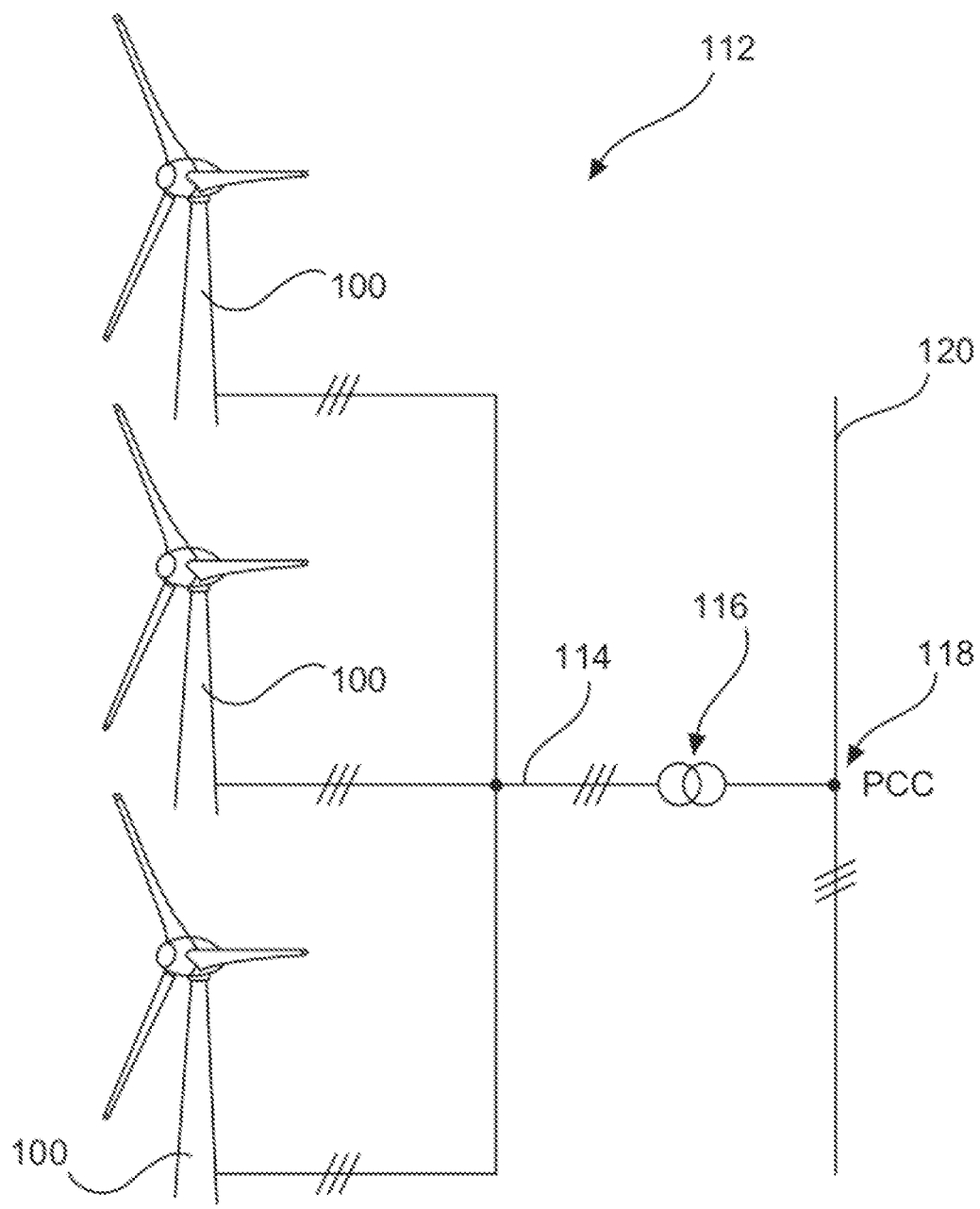
FIG. 2 shows a wind farm in a schematic illustration.

FIG. 2 shows a wind farm 112 comprising, by way of example, three wind turbines 100, which may be identical or different. The three wind turbines 100 are therefore representative of, in principle, any desired number of wind turbines in a wind farm 112. The wind turbines 100 provide their power, namely in particular the generated current, over an electrical farm grid 114. In this case, the respectively generated currents or powers of the individual wind turbines 100 are added, and usually a transformer 116 is provided, which steps up the voltage in the farm in order to then inject this into the supply grid 120 at the injection point 118, which is also generally referred to as the PCC. FIG. 2 is merely a simplified illustration of a wind farm 112, which does not show any control, for example, although naturally control is provided. For example, the farm grid 114 can also be configured differently by virtue of, for example, a transformer also being provided at the output of each wind turbine 100, to name but one other exemplary embodiment.

Both the wind turbine shown in FIG. 1 and the wind farm shown in FIG. 2 can each form a wind power system.

Figure 3:
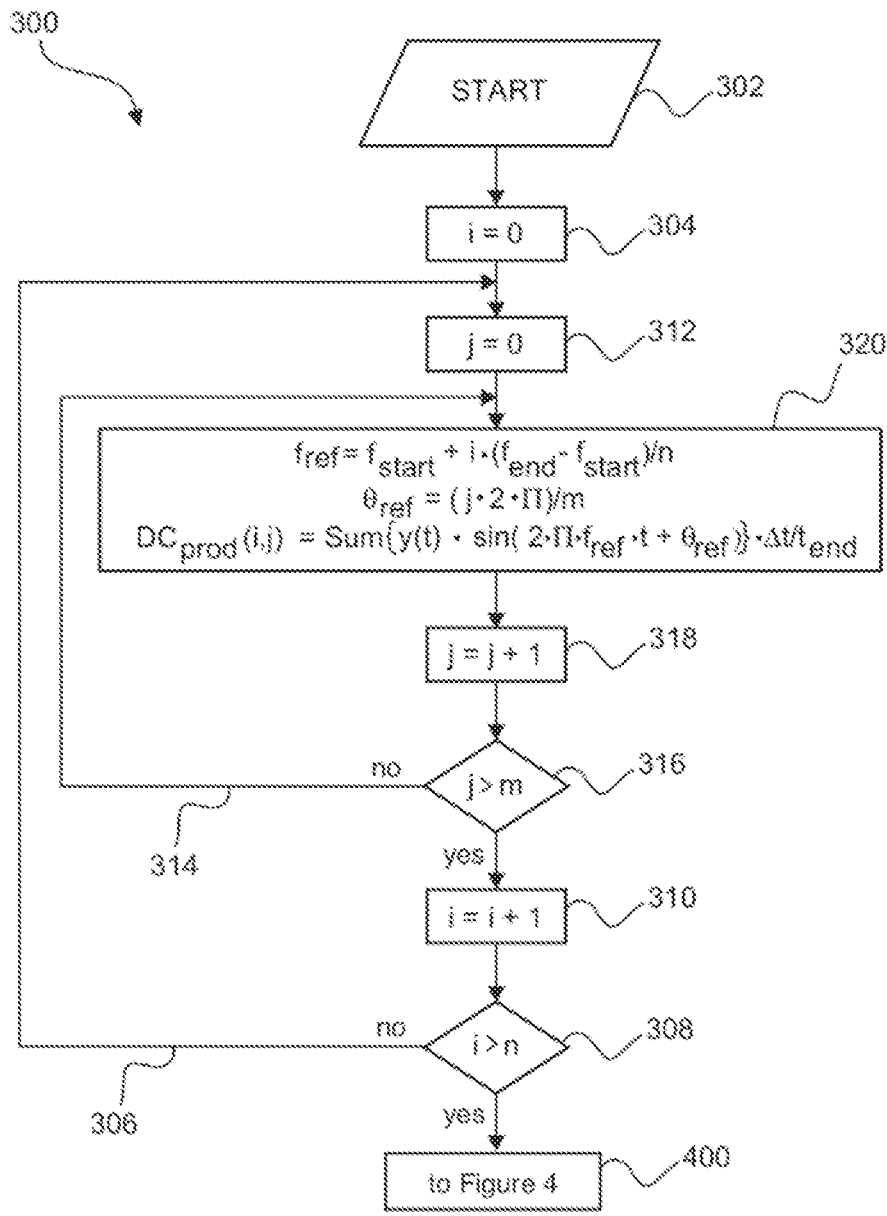
FIG. 3 shows a flowchart for recording a plurality of product sums whilst varying a test frequency and varying a test angle.

FIG. 3 shows a flowchart 300 for recording a plurality of product sums. In the start block 302, the signal to be investigated is recorded and further initialization is performed. The signal to be investigated may be a recorded time signal, which is sampled uniformly for investigation in the flowchart 300 with the time steps Δt. The signal to be investigated can also already be present in such a sampled form, but advantageously here the time increment is selected in order to thereby also fix the number of values to be investigated in total.

The signal y(t) to be investigated is therefore recorded or considered for a measurement time period and the measurement time period may extend from t=0 to t=$t_{end}$. The measurement duration and therefore width of the measurement time period is therefore fixed by $t_{end}$. For time t the following therefore applies:

$$t=0, 1 \cdot \Delta t, 2 \cdot \Delta t, \ldots, t_{end}$$

Likewise, in the start block 302, the frequency range to be investigated from a start frequency $f_{start}$ up to an end frequency $f_{end}$ can be fixed. The increment $\Delta f$ of the frequency investigation can be fixed depending on the start frequency $f_{start}$ and the end frequency $f_{end}$ and depending on the desired frequency step number n according to the following formula:

$$\Delta f = (f_{end} - f_{start})/n$$

The increment of the phase angle investigation $\Delta\varphi$ can likewise be fixed depending on a desired angle step number m according to the following formula:

$$\Delta\varphi = (2 \cdot \pi)/m$$

These values, in particular the frequency step number n and the angle step number m and also the time step $\Delta t$ can in principle be selected as desired, but it is proposed to draw a balance in the selection between accuracy and computational complexity.

In the first initialization block 304, the control variable i is initialized for an outer loop 306. The rate at which this outer loop 306 is executed corresponds to the frequency step number n and this is tested correspondingly in the first repetition request block 308, which follows the first increment block 310.

Within this outer loop 306 there is the second initialization block 312, in which the control variable j for an inner loop 314 is initialized. It is executed corresponding to the angle step number m, which is requested in the second repetition request 316, which follows the second increment block 318.

Finally, a calculation block 320 is provided, which is executed correspondingly (n×m) times. With each execution run, the reference frequency $f_{ref}$ is calculated, namely the frequency with respect to which in each case a sum product is calculated. This reference frequency $f_{ref}$ is calculated according to the following formula:

$$f_{ref} = f_{start} + i \cdot (f_{end} - f_{start})/n$$

At the same time, the respective reference angle $\theta_{ref}$ is calculated, namely according to the following formula:

$$\theta_{ref} = (j \cdot 2 \cdot \pi)/m$$

Finally, the product sum is then calculated on the basis of these calculated values, i.e., for the value relevant in the execution run for the reference frequency $f_{ref}$ and the reference angle $\theta_{ref}$. The product sum can also be understood to mean the DC component, as has been explained above, with the result that the product sum here is denoted by $DC_{prod}$. It is therefore calculated for the respective execution run i of the outer loop and the respective execution run j of the inner loop according to the following formula:

$$DC_{prod}(i,j) = \text{sum}\{y(t) \cdot \sin(2 \cdot \pi \cdot f_{ref} \cdot t + \theta_{ref})\} \cdot \Delta t / t_{end}$$

Therefore, as the series of measurements, the signal y(t) to be investigated is multiplied by the sine function sin $(2 \cdot \pi \cdot f_{ref} \cdot t + \theta_{ref})$ and by this means the sum is formed. Therefore, a product is also formed here for each time point and these products are summated. This can be performed, for example, by a third innermost loop, in order to explain this illustratively, in which the time t increments from 0 to $t_{end}$, namely in the time steps $\Delta t$. The result is also standardized by multiplication by the time step $\Delta t$ and division by the end time $t_{end}$, namely in such a way that the product sum $DC_{prod}$ is in principle independent of the time step $\Delta t$. The product sum is therefore in principle, in terms of its absolute value, independent of the number of summated products.

Once the inner loop 314 has been executed m times and the outer loop 306 has been executed n times, there are n×m individual product sums $DC_{prod}$ (i, j), which can be stored in a corresponding field and can then be investigated for further evaluation. For this purpose, the result of the flowchart 300 is passed on to the flowchart 400 in FIG. 4, which is indicated in the flowchart 300 by the block 400.

Figure 4:
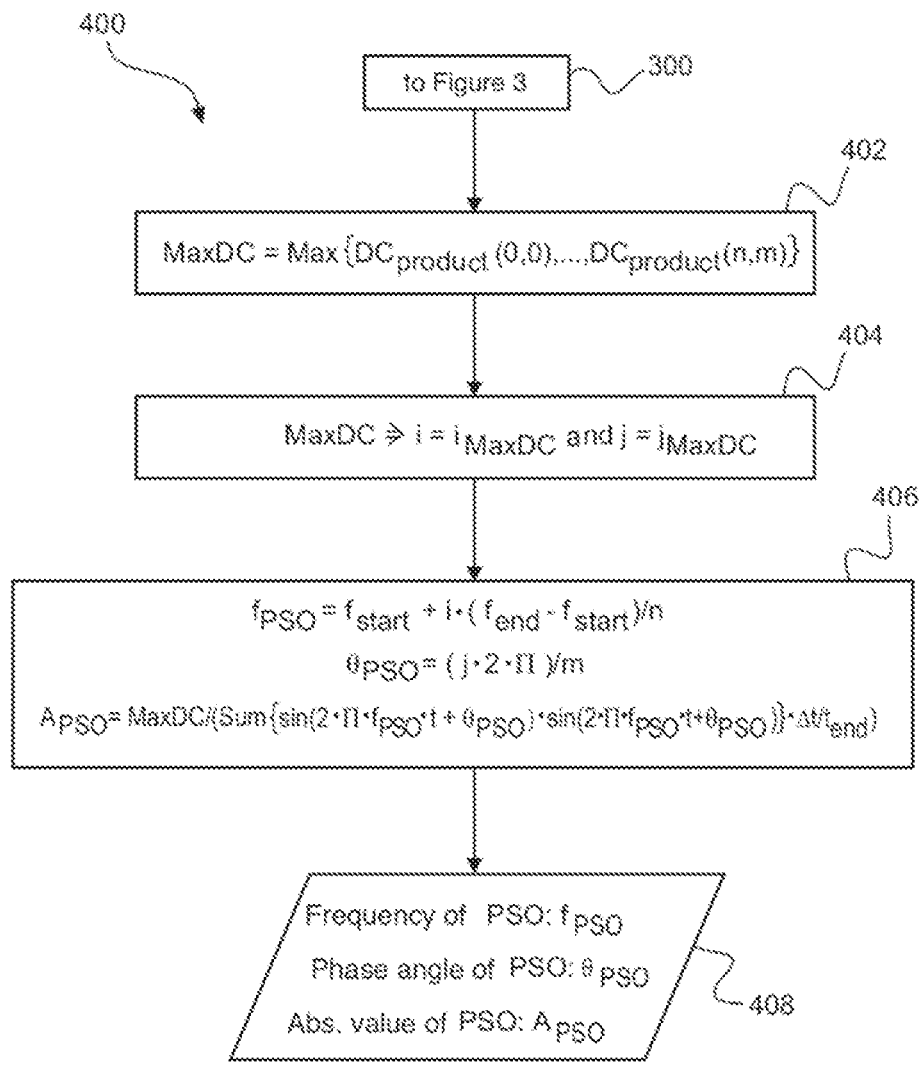
FIG. 4 shows a flowchart for evaluating a plurality of product sums recorded in accordance with the flowchart shown in FIG. 3.

Correspondingly, FIG. 4 shows this block 400, namely the flowchart 400, and this builds upon the flowchart 300 in FIG. 3, which is indicated by the fact that the first block is denoted as flow block 300.

In the Max block 402, the product sum with the greatest value is sought from among all of the product sums which were calculated in the calculation block 320, namely taking into consideration the mathematical sign. If, in order to simplify or reduce the complexity, the test angle were not to be varied over 360°, but only over 180°—preferably it is also possible for it to be varied only over 90°—, it would also be possible here for the greatest value in terms of absolute value to be sought.

The search is performed for all of the product sums which in particular have been stored in a field, namely for each execution run of the outer loop 306 and the inner loop 314. These loops were namely executed with the outer control variable i and the inner control variable j, and these two control variables then here also serve to identify the maximum product sum, for example, in a data field. Correspondingly, in the identification block 404, an assignment of these two control variables is performed, namely according to which the control variables i and j in relation to which the maximum product sum was found in the Max block 402 are identified as selected outer and selected inner control variable $i_{Max\ DC}$ and $j_{Max\ DC}$, respectively.

The maximum value of the product sums detected in block 402 belongs to these two selected control variables, namely the selected outer and the selected inner control variable $i_{Max\ DC}$ and $j_{Max\ DC}$, respectively, and a reference frequency and a reference angle belong to said maximum value. The corresponding reference frequency and the corresponding reference angle can be calculated from the corresponding outer and inner control variable i,j, respectively. For this frequency and this angle, it is assumed that this is the corresponding frequency of a low-frequency oscillation and the corresponding angle of a low-frequency oscillation, respectively, with the result that this associated reference frequency is referred to as the frequency of the low-frequency oscillation $f_{PSO}$, and the selected angle is referred to as the angle of the low-frequency oscillation $\theta_{PSO}$. These two values can be calculated according to the following equation:

$$f_{PSO} = f_{start} + i \cdot (f_{end} - f_{start})/n$$

$$\theta_{PSO} = (j \cdot 2 \cdot \pi)/m$$

And the frequency of the low-frequency oscillation $f_{PSO}$ and the angle of the low-frequency oscillation $\theta_{PSO}$ are calculated when the corresponding selected control variable $i_{Max\,DC}$ and $j_{Max\,DC}$, respectively, is used for the respective outer and inner control variable i, j. In this formula, the angle of the low-frequency oscillation $\theta_{PSO}$ is given in rad and not in degrees.

In the calculation block 406, an amplitude of the low-frequency oscillation $A_{PSO}$ can also be calculated, namely according to the following equation:

$$A_{PSO} = \mathrm{Max}DC/(\mathrm{sum}\{\sin(2 \cdot \pi \cdot f_{PSO} \cdot t + \theta_{PSO}) \cdot \sin(2 \cdot \pi \cdot f_{PSO} \cdot t + \theta_{PSO})\} \cdot \Delta t/t_{end})$$

The amplitude of the low-frequency oscillation therefore results from the fact that the detected maximum product sum is divided by a corresponding product sum of the reference signal multiplied by the reference signal for the entire investigated time range. Therefore, the product sum of the reference signal is determined by itself during the multiplication, which results in the maximum possible value because such a reference function correlates with itself to a maximum extent. It therefore remains a factor with respect to the less correlated product sum between the investigated signal and the reference signal. This amplitude $A_{PSO}$ is in this case likewise a standardized variable.

The results can therefore be output in the output block 408 and used further.

Figure 5:
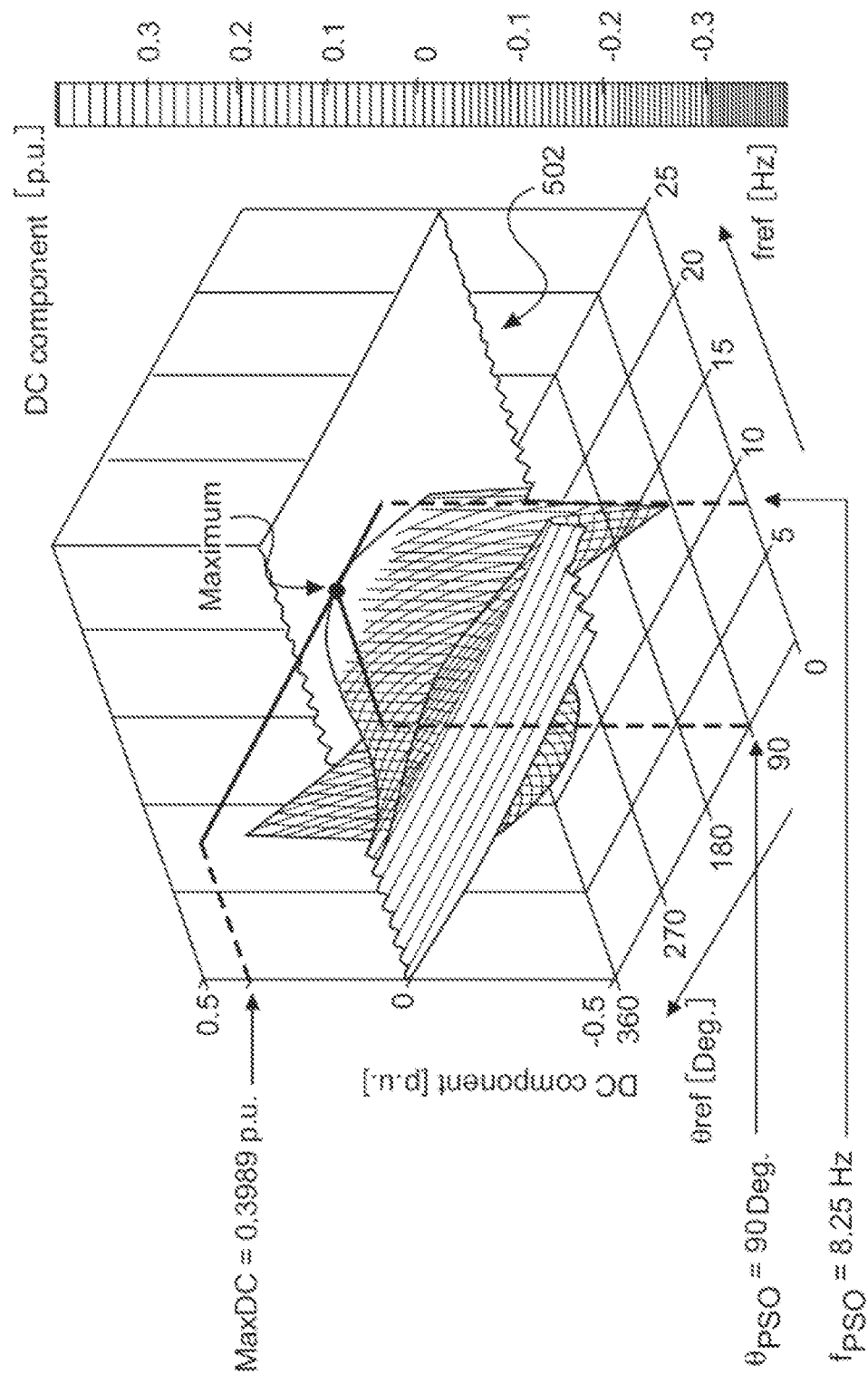
FIG. 5 shows, in a 3D graph, product sums depending on a varied test frequency and depending on a varied test angle.

FIG. 5 illustrates, in a three-dimensional representation 500, the entirety of all of the product sums which were calculated in the calculation block 320 as a curved plane 502 as a function of the varied reference frequency $f_{ref}$ and the varied reference angle $\theta_{ref}$. The reference frequency $f_{ref}$ can also be referred to synonymously as test frequency, and the reference angle $\theta_{ref}$ can also be referred to synonymously as test angle.

By way of example, a signal to be investigated has been selected which has a low-frequency oscillation with an oscillation frequency of 8.25 Hz ($f_{PSO}$=8.25 Hz) at a phase angle of 90° ($\theta_{PSO}$=90°). For this purpose, a reference angle or test angle is varied from 0° to 360°, and a reference frequency or test frequency is varied from 0 to 25 Hz. It should be noted that for frequencies deviating severely from this oscillation frequency of 8.25 Hz, the product sums indicated in the curved plane 502 have substantially the value 0. In the vicinity of the oscillation frequency of 8.25 Hz, the amplitude increases in oscillatory fashion towards the oscillation frequency. However, it should also be noted that the reference angle or the test angle likewise plays a significant role. In the case of the oscillation frequency and the phase angle of the low-frequency oscillation, the absolute amplitude of the product sum is then also at a maximum and correspondingly the frequency of the low-frequency oscillation $f_{PSO}$ and the phase angle of the low-frequency oscillation $\theta_{PSO}$ can be read from the graph or from the value field of the product sums.

The flowchart in FIG. 3 and indirectly also in FIG. 4 and also the graph in FIG. 5 relate to the case where the test frequency or reference frequency and also the test angle or the reference angle have each only been varied once, to be precise in each case with many values, but without repeating in particular the entire sequence of the outer and inner loop in accordance with the flowchart 300 with new values. This representation particularly in FIG. 3 to this extent serves an illustrative purpose and preferably in particular the entire sequence in accordance with the two flowcharts 300 and 400 is repeated with focused values for the range of the frequency to be investigated, i.e., for the frequency range to be investigated and also for new values for the angle range to be investigated. For this purpose, in the start block 302, correspondingly new values in the vicinity of the roughly identified maximum are determined, in particular on the basis of the values provided in the first execution run in the output block 408 for the frequency of the low-frequency oscillation $f_{PSO}$ and the phase angle of the low-frequency oscillation $\theta_{PSO}$.

Figure 6:
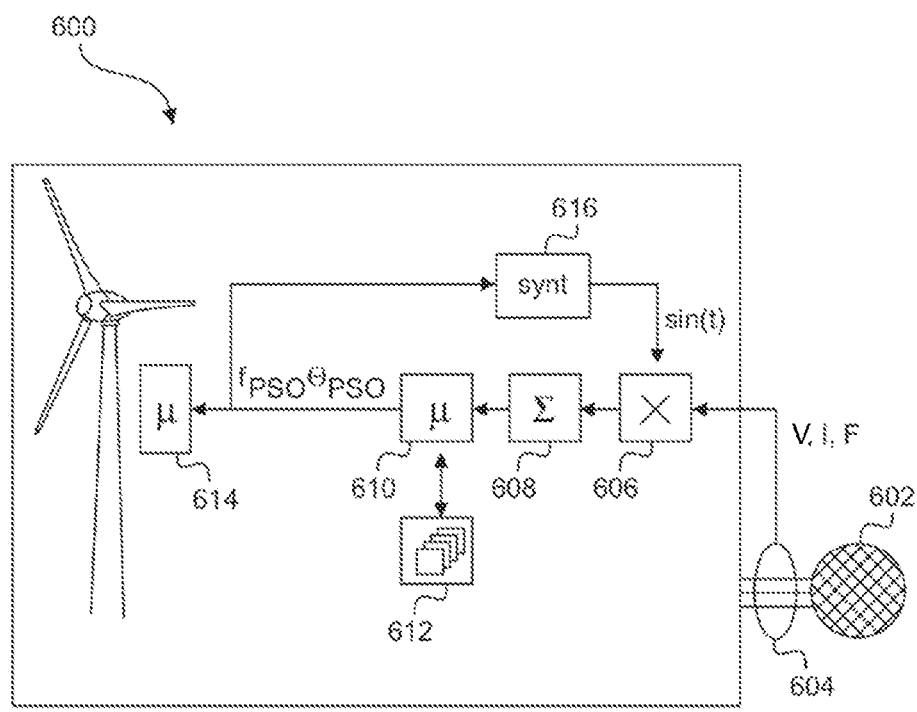
FIG. 6 shows, schematically, a structure of a wind power system for detecting low-frequency oscillations.

FIG. 6 shows a wind power system 600, which is illustrated symbolically by a single wind turbine, but can also have a plurality of wind turbines. Said system is set up for detecting subsynchronous resonances in an electrical supply grid 602 into which the wind power system 600 injects.

A recording means (voltmeter, ammeter, multimeter, or oscilloscope) 604 for recording at least one series of measurements of a grid variable is provided which can detect a line voltage, an injected current or a line frequency. The series of measurements thus detected is passed on to a multiplication unit (controller) 606, which can perform a multiplication by a test function sin(t). This test function sin(t) is here to this extent only mentioned symbolically and is, as has also been described above, more complex than such a sine function, can be varied at least in respect of some input variables.

The result of this multiplication unit 606 is passed on to an addition unit (controller) 608, in which the test products which were generated in the multiplication unit 606 were added to give a product sum. Thus, a product sum is the result of the addition unit 608, and this is passed on to an evaluation device (controller) 610. The evaluation device in this case searches for a maximum of all of the product sums which it has obtained from the multiplication unit 606. For this purpose, a storage device (memory) 612 can be provided for recording a data field, which is here shown as part of the evaluation device 610. The result of the evaluation device is finally, if a low-frequency oscillation has been found, its oscillation frequency $f_{PSO}$ and its phase angle $\theta_{PSO}$. These values can then be further-processed by a further process control computer (controller) 614 in order, for example, to adapt an injection (converter or inverter) by the wind power system 600 into the electrical supply grid 602 in such a way that such a detected oscillation is counteracted. In addition, these two values, i.e., the frequency and the phase angle of the low-frequency oscillation, can be passed back to a synthesis block (controller) 616, which generates the already described test function, which is represented symbolically as sin(t), or adapts it in a further loop. In particular its input values are in this case adapted.

Therefore, particular consideration has been given to the fact that the detection of low-frequency oscillations (PSO/power system oscillations) and the parameters thereof can be a requirement. This is particularly because low-frequency oscillations generally have very low-frequency components. The problem consists not only in detecting whether an oscillation exists at all, but then also in identifying this oscillation, namely particularly identifying which frequency is present, which phase angle and which absolute value of the oscillation.

In principle, a known DFT method could be used. However, it has been identified that such a DFT method, depending on the sampling rate of the signal, provides information over a broad frequency range, which is not necessarily helpful. Furthermore, a DFT method requires a correspondingly long time window within the time range for finer resolution in the frequency range. In this case, it has been identified that the frequencies to be expected in the context of low-frequency oscillations are within a limited frequency range, and this can be utilized and other effective approaches which concentrate on such a limited frequency range may be helpful. It is also advantageous if corresponding approaches require a relatively short time window.

Energy systems are oscillatory systems, which have natural modes below and above the system frequency (50, 60 Hz). On excitation, such oscillations can impair the system stability if they are not sufficiently damped. Here, a new approach for detection of so-called power system oscillations (PSO) is now proposed. A possible precise identification of the frequency, the phase angle and the absolute value of power system oscillations (PSO) is intended to be achieved from a signal.

The monitoring of power system oscillations (PSO) may be helpful not only as a warning system for the operation of wind farms, but this information can also be used as a basis for a suitable generation of damping signals by wind turbines or wind farms for damping the power system oscillations.

It has also in particular been identified that the monitoring of power system oscillations (PSO), i.e., in particular low-frequency oscillations, may be an important component of a warning system also for the operation of wind farms. In addition, most approaches for damping PSO are based on a precise identification of an oscillation from a measurement.

The proposed method enables in particular the identification of PSO (or other types of oscillations) and their most important features (frequency, phase angle and absolute value).

The proposed, present method is aimed in particular at a possible precise identification of the frequency, the phase angle and the absolute value of an oscillation in a measured signal using as short a measurement window as possible. In this case, frequent restrictions of real systems such as computation capacity, storage space for the measured data, assumptions in respect of a constant working point are taken into consideration.

The proposed approach is based on the principle that the DC component of the product of the signal to be investigated having a sinusoidal reference signal which has the frequency $f_{ref}$ is only associated with the component of the signal in terms of frequency $f_{ref}$. All of the other signal components which do not have this frequency of the reference signal virtually average one another out, expressed illustratively.

The basic concept can be summarized as follows. The signal to be investigated is multiplied by a sinusoidal reference signal. In the process, the phase angle of the reference signal is changed by m iterations in a loop in the complete range (0 up to $2\pi$ or 0° up to 360°). Furthermore, the frequency of the reference signal is changed in a further loop by n iterations in the frequency range to be investigated ($f_{start}$ up to $f_{end}$). m×n products thus result. The frequency and the phase angle at which the DC component of the product is at its highest can be assumed to be the frequency and the phase angle of the low-frequency oscillation. By virtue of the knowledge of the frequency and the phase angle, the absolute value of the low-frequency oscillation can also be determined. This sequence is substantially illustrated in FIGS. 3 and 4.

The accuracy of the approach for a specific frequency range ($f_{start}$ to $f_{end}$) can be improved by increasing the parameters m and n if, therefore, the two loops 306 and 314 shown in FIG. 3 are executed more often and with smaller steps. One possibility of optimizing the computation complexity involved is to implement the proposed approach shown in FIGS. 3 and 4 in two stages:

1. The first stage has a rough resolution (($f_{end}-f_{start}$)/n) and provides as a result a rough estimate of the frequency of PSO ($f_{PSO1}$ below). For this purpose, the following values are recommended for the investigation parameters:

$$f_{start1} = f_{start}$$

$$f_{end1} = f_{end}$$

$n_1$ = the next integral number according to $(f_{end}-f_{start}) \cdot t_{end} \cdot 2$ $$m_1 = 36$$

2. Then, the second stage investigates a smaller frequency range around the result of the first stage with a finer resolution. For this purpose, the following values are recommended for the investigation parameters:

$$f_{start2} = f_{PSO1} - 1/(t_{end} \cdot 2)$$

$$f_{end2} = f_{PSO1} + 1/(t_{end} \cdot 2)$$

$n_2$: as high as possible ($\geq 2$)

$m_2$: as high as possible ($\geq 36$)

$n_1$ and $n_2$ denote the first and second repetition number, respectively, of the loop for the frequency variation.

$m_1$ and $m_2$ denote the first and second repetition number, respectively, of the loop for the phase angle variation.

Advantages Over FFT and DFT (Standard Methods):

In the case of FFT and DFT, it is possible to identify only the oscillations with specific frequencies, namely: oscillations whose frequencies correspond to an integral multiple of 1/T (T: length of the investigation time window). Since the frequency of PSO is an unknown variable, it is very improbable that the frequency of PSO by chance corresponds to an integral multiple of 1/T. Therefore, when using FFT or DFT a certain degree of error in the determination of the frequency should always be expected. The error in the frequency determination impairs the determination of phase angle and absolute value. In contrast to FFT and DFT, in the proposed approach the frequency range can be investigated as finely as desired. In this case, it is merely necessary to find a compromise between the accuracy and the computation complexity. FFT provides, as a result, information on specific spectral lines. The number of spectral lines is linked to the number of measurement points of the signal to be investigated. In the case of FFT, it is not possible to investigate some of these spectral lines. In other words, there is no possibility for performing the FFT calculation for a limited frequency range. In contrast, the investigation range for the frequency in the proposed approach can be selected as desired. Furthermore, it is possible to select the computation complexity by selecting the investigation resolution appropriately for the computation capacity available.

FIG. 7 shows a flow chart for a portion of a method of detecting low-frequency oscillations in an electrical supply grid. At step 702, a plurality of products of the plurality of measurement points are summed to produce a product sum. The summing of the plurality of products includes retaining a plurality of signs of the plurality of products, respectively. At step 704, determining, based on the product sum, whether the at least one series of measurements have a low-frequency oscillation having an oscillation frequency in a region of the test frequency and a phase angle in a region of the test angle, wherein the oscillation frequency is below the rated line frequency.

The invention claimed is:

1. A method for detecting low-frequency oscillations in an electrical supply grid having a line voltage and associated with a rated line frequency, comprising:
    recording at least one series of measurements having a plurality of measurement points of a grid variable over a measurement time period for performing a frequency analysis on the at least one series of measurements;
    multiplying each measurement point of the at least one series of measurements by a time-dependent sinusoidal test function for the measurement time period to obtain a product for each measurement point, wherein the test function has a test frequency and a test angle as phase angle;
    summing a plurality of products of the plurality of measurement points to produce a product sum, wherein summing the plurality of products includes retaining a plurality of signs of the plurality of products, respectively; and
    determining, based on the product sum, whether the at least one series of measurements has a low-frequency oscillation having an oscillation frequency in a region of the test frequency and a phase angle in a region of the test angle, wherein the oscillation frequency is below the rated line frequency.

2. The method as claimed in claim 1, comprising:
    repeating multiplying each measurement point of the at least one series of measurements by the test function and summing the plurality of products while varying the test frequency and/or varying the test angle to obtain a plurality of product sums; and
    determining whether the at least one series of measurements has the low-frequency oscillation depending on the plurality of product sums.

3. The method as claimed in claim 1, wherein:
    repeating multiplying each measurement point of the at least one series of measurements by the test function and summing the plurality of products while varying the test frequency and varying the test angle to obtain a product sum as each test pair is formed by a test frequency value and a test angle value.

4. The method as claimed in claim 1, comprising:
    detecting the low-frequency oscillation based on the product sum by determining whether the product sum reaches at least a predetermined test amplitude.

5. The method as claimed in claim 1, comprising:
    repeating multiplying each measurement point of the at least one series of measurements by the test function and summing the plurality of products while varying the test frequency in a first test loop, wherein:
        the test frequency is varied within a first frequency range in the first test loop to detect the low-frequency oscillation having the oscillation frequency, and the oscillation frequency is detected with a first accuracy; and
    repeating multiplying each measurement point of the at least one series of measurements by the test function and adding the plurality of products while varying the test frequency in a second test loop, wherein:
        the test frequency is varied within a second frequency range in the second test loop; and
        the second frequency range is selected depending on the oscillation frequency detected in the first test loop to detect the oscillation frequency with a higher accuracy than in the first test loop.

6. The method as claimed in claim 1, comprising:
    recording a plurality of series of measurements of the grid variable, wherein:
        each series of measurements of the plurality of series of measurements is recorded for analyzing a respective frequency range,
        for each series of measurements of the plurality of series of measurements, a respective measurement time period is selected depending on the respective frequency range,
        for each series of measurements of the plurality of series of measurements, multiplying each measurement point of the series of measurements by the test function and summing the plurality products to produce the product sum is repeated while varying the test frequency and/or varying the test angle to obtain a respective plurality of product sums for each series of measurements, and
        for each series of measurements, the respective plurality of product sums are evaluated for detecting the low-frequency oscillation.

7. The method as claimed in claim 1, wherein:
    repeating multiplying each measurement point of the at least one series of measurements by the test function and summing the plurality of products to give the product sum while varying the test frequency, wherein:
        the test frequency is varied within at least one frequency range having an upper frequency value and a lower frequency value and using a frequency increment, and
        the frequency increment is set depending on the frequency range.

8. The method as claimed in claim 1, wherein the low-frequency oscillations are sub synchronous resonances.

9. The method as claimed in claim 1, wherein the oscillation frequency is 1 hertz (Hz) or less.

10. The method as claimed in claim 1, wherein the grid variable is the line voltage, an input current or a line frequency of the electrical supply grid.

11. The method as claimed in claim 2, comprising:
    when a first product sum has a maximum amplitude in relation to the plurality of product sums, detecting the low-frequency oscillation in the first product sum having an associated first frequency and an associated first phase of a first test frequency and a first test angle, and/or
    in response to detecting the low-frequency oscillation, detecting an amplitude of the low-frequency oscillation.

12. The method as claimed in claim 3, comprising:
    obtaining a curved area in three-dimensional space depending on test frequency values and test angle values for test pairs; and
    identifying the test frequency and phase angle of the low-frequency oscillation as a first test frequency value and a first test angle of the test pairs at which in relation the product sum has a maximum in relation to remaining product sums.

13. The method as claimed in claim 5, comprising:
repeating multiplying each measurement point of the at least one series of measurements by the test function and summing the plurality of products while varying the test angle in the first test loop, wherein:
the test angle is varied within a first angle range, and the test angle is varied with a first angle increment; and
repeating multiplying each measurement point of the at least one series of measurements by the test function and summing the plurality of products while varying the test angle in the second test loop, wherein:
the test angle is varied within a second angle range, and
the second angle range is selected depending on the phase angle of the low-frequency oscillation detected in the first test loop to detect the phase angle of the low-frequency oscillation with a higher accuracy than in the first loop.

14. The method as claimed in claim 5, wherein:
in the first test loop, the test frequency is varied with larger frequency steps than in the second test loop, and/or
in the first test loop, the test angle is varied with larger angle steps than in the second test loop.

15. The method as claimed in claim 7, wherein the frequency increment is set depending on the frequency range such that:
the frequency increment is less than the lower frequency value; and/or
the frequency increment is less than a predetermined percentage value of the upper frequency value.

16. The method as claimed in claim 7, wherein:
the test frequency is varied within a plurality of frequency ranges, and frequency increments of different frequency ranges are different than each other, and
each frequency increment is greater than a predetermined percentage of the respective lower frequency value of the respective frequency range.

17. The method as claimed in claim 13, wherein the test angle is varied within the second angle range a second angle increment that is less than the first angle increment.

18. The method as claimed in claim 15, wherein the frequency increment is less than 10% of the lower frequency value and/or the predetermined percentage value is less than 1% of the upper frequency value.

19. A wind power system for detecting low-frequency oscillations in an electrical supply grid having a line voltage and associated with a rated line frequency, the wind power system comprising:
a controller configured to:
record at least one series of measurements having a plurality of measurement points of a grid variable over a measurement time period for performing a frequency analysis on the at least one series of measurements;
multiplying each measurement point of the at least one series of measurements by a time-dependent sinusoidal test function for the measurement time period, wherein the test function has a test frequency and a test angle as phase angle;
sum a plurality of products of the plurality of measurement points to produce a product sum, wherein summing the plurality of products includes retaining a plurality of signs of the plurality of products, respectively; and
determining, based on the product sum, whether the at least one series of measurements has a low-frequency oscillation having a frequency in a region of the test frequency and a phase angle in a region of the test angle.

* * * * *